United States Patent [19]

Falik et al.

[11] Patent Number: 5,600,821
[45] Date of Patent: Feb. 4, 1997

[54] DISTRIBUTED DIRECTORY FOR INFORMATION STORED ON AUDIO QUALITY MEMORY DEVICES

[75] Inventors: Ohad Falik, Petach-Tikva; Gideon Intrater, Ramat Gan; Zeev Collin, Haifa, all of Israel

[73] Assignee: National Semiconductor Corporation, Santa Clara, Calif.

[21] Appl. No.: 98,203

[22] Filed: Jul. 28, 1993

[51] Int. Cl.⁶ .................................................. G06F 12/08
[52] U.S. Cl. .............................. 395/497.04; 395/182.04; 379/88
[58] Field of Search .............................. 364/200 MS File, 364/900 MS File; 395/400, 425, 182.04, 429, 430, 431, 432; 365/230.03; 379/67, 68, 83, 88, 89

[56] References Cited

U.S. PATENT DOCUMENTS

| | | | |
|---|---|---|---|
| 4,794,474 | 12/1988 | Dwyer et al. | 360/72.2 |
| 4,914,529 | 4/1990 | Bonke | 360/48 |
| 4,930,129 | 5/1990 | Takahira | 371/404 |
| 4,998,009 | 3/1991 | Iijima et al. | 235/487 |
| 5,226,145 | 7/1993 | Moronaga et al. | 395/425 |
| 5,243,570 | 9/1993 | Saruwatari | 365/201 |
| 5,297,148 | 3/1994 | Harari et al. | 371/10.2 |
| 5,305,448 | 4/1994 | Insalaco et al. | 395/425 |
| 5,355,481 | 10/1994 | Sluijter | 395/600 |
| 5,357,473 | 10/1994 | Mizuno et al. | 365/201 |
| 5,404,485 | 4/1995 | Ban | 395/412 |
| 5,434,910 | 7/1995 | Johnson et al. | 379/89 |

FOREIGN PATENT DOCUMENTS

| | | |
|---|---|---|
| 0220718 | 5/1987 | European Pat. Off. |
| 3518737 | 11/1986 | Germany. |
| 62-283496 | 12/1987 | Japan. |
| 62-283497 | 12/1987 | Japan. |

OTHER PUBLICATIONS

G. Ferris et al., "Design of a Full-Featured, Solid-State Telephone Answering Device," *IEEE 1989 International Conference on Consumer Electronics*, (Jun. 1989), pp. 320-321.

*Primary Examiner*—Matthew M. Kim
*Assistant Examiner*—Hiep T. Nguyen

[57] ABSTRACT

A directory for a plurality of information items stored in an electronic memory device is not retained in a continuous error-free portion of memory. Instead the memory area of the device is divided into blocks, with each block being assigned to no more than one information item. Each block is required to have a "recoverable" portion of memory that need not be error-free but from which original data can be accurately read, with the assistance of an error correction algorithm, despite the presence of certain error(s). Directory data for a block are stored in such block, thereby markedly reducing the length of a continuous portion of memory needed to store the directory data.

28 Claims, 9 Drawing Sheets

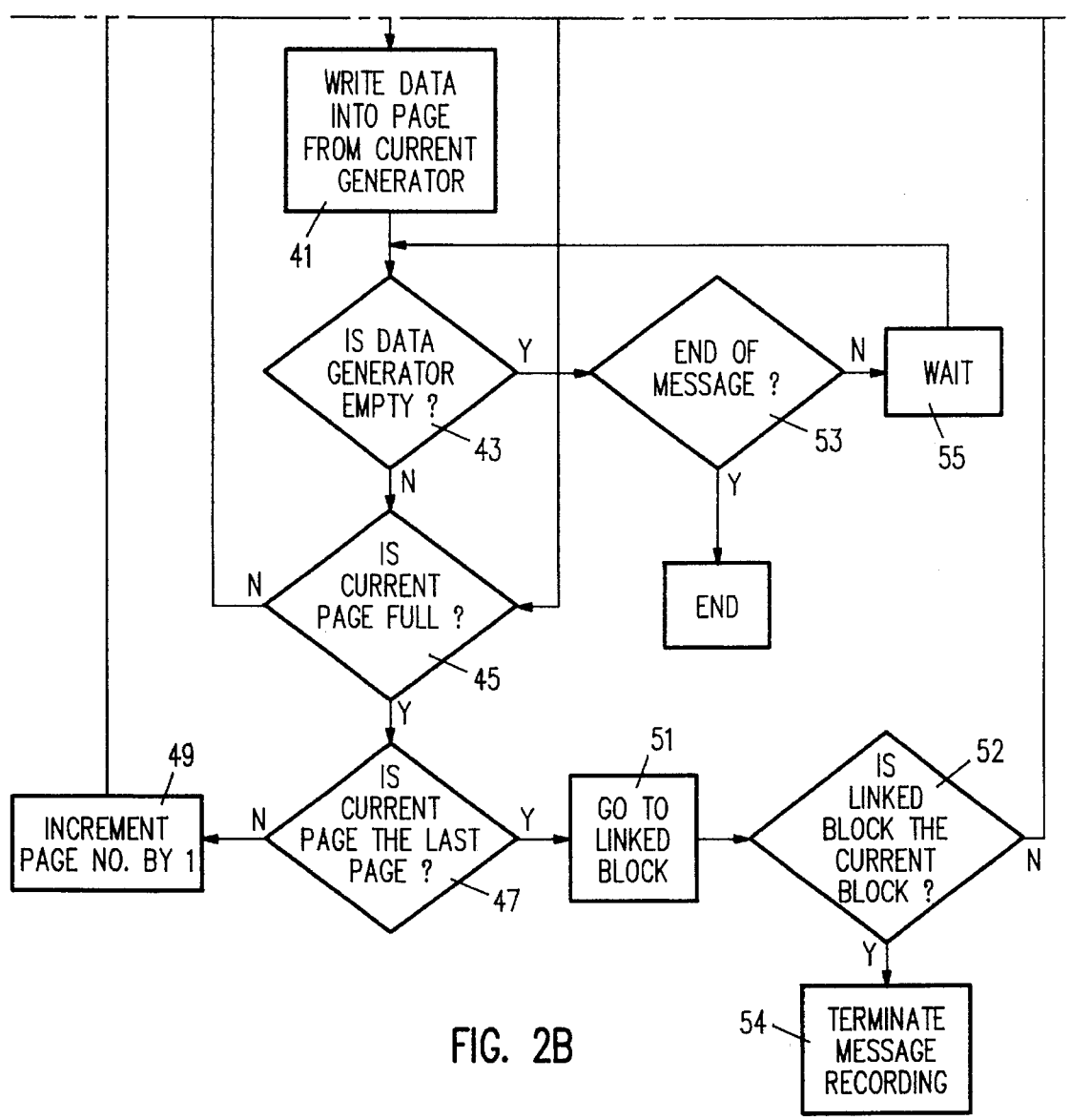
FIG. 2B
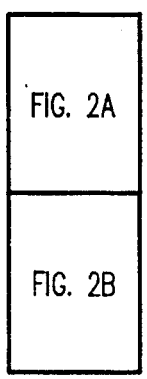
KEY TO FIG. 2

DISTRIBUTED DIRECTORY FOR INFORMATION STORED ON AUDIO QUALITY MEMORY DEVICES

BACKGROUND OF THE INVENTION

The present invention is directed to providing a directory for data stored in a memory and, in particular, to a technique which avoids the necessity of having an error free section in the memory for storing the directory.

Two well known types of electronic memory devices are dynamic random access memories ("DRAM") and Flash electrically erasable and programmable read only memories ("FLASH"). DRAM and FLASH devices are often put to use in applications which require them to be defect free, or essentially so. However, various applications exist which can tolerate a certain number of defects in the memory. One example is in the area of voice and other audio information storage, such as in a telephone answering machine. Due to the somewhat forgiving nature of the human ear and brain, loss or alteration of a certain portion of data related to such information can be tolerated. Consequently, it is not necessary to use an error free memory. Instead, memory devices with a specified defect level can provide an adequate degree of performance, and the advantage in using such devices is that they can be obtained at a significant cost saving.

A DRAM having a quality of a less than a defect-free grade, and for further cost reductions may also have relaxed AC and DC specifications, but which is nevertheless usable in the above-described type of applications is commonly known as an audio quality DRAM ("ARAM"), and is available from Micron Customer Manufacturing Services, Inc. of Boise, Id. as 4P4001JDJ-4N. The term "grade" is used herein to denote the number of errors in data stored in the ARAM which still allow the ARAM or a portion of it to be used, and this depends on the voice storage format/compression algorithm, the storage method and the desired voice quality/price trade-off. A FLASH with comparable characteristics for this purpose is referred to herein as an AFLASH.

Various items of information can be retained in memory by storing associated units of data related thereto. For example, in an application such as a telephone answering machine, the items of information are the recorded voice messages. Each message can be regarded as one item of information. Digital bits of data are stored in the memory, with such bits that are associated with each other jointly composing one recorded message. The memory must store not only the audio information but also a directory which contains information on the location of recorded voice messages. Two approaches have been used for handling the directory stored in an ARAM, namely (1) static data and (2) garbage collection, In the static data method, as used in the "NSVOICE Revision 2.2" software package available from National Semiconductor Corp. of Santa Clara, Calif. under the code no. NSW-VC-BCSX4, the data storage area of the memory is virtually partitioned into blocks. Each block includes one message or part of a message. A certain portion of the memory is dedicated to the directory in which one entry per block is made. For example, an entry can be a storage location that holds a unit of data such as a byte which identifies what data is stored in the associated block, as by a message number. Certain values are reserved to indicate an empty block or an unusable block. Initially, the data derived from the received voice message(s) is stored in the first "n" free blocks. As a block is used for data storage it is marked with an identification code ("ID"), such as the message number. When a particular message is erased, every block having the corresponding ID is marked as being "free" for subsequent use in recording another message. Thus, eventually the directory may link blocks dispersed throughout the memory to form one message, and the data storage portion of the memory may have free and filled blocks interspersed with each other.

In the garbage collection approach, as used in the model D6055A answering machine available from The DSP Group, Inc. of San Jose, Calif., the data is always stored sequentially, message after message, with no intervening free blocks. As a message is erased, the resulting "hole" is closed by copying all of the remaining stored data with a process called "garbage collection". The directory contains pointers to the beginning of each message and to the beginning of the free memory. The copied data is then sequentially re-stored into the memory so as to fill the first "m" blocks, as required, to thereby close the "hole". Due to repetitive movements of the data with this scheme, it is necessary to apply error correction to all the data. This prevents deterioration in the quality of the data due to an accumulation of errors during copying.

A significant disadvantage attendant to the use of both of the above-described approaches is the need for a lengthy, continuous portion of memory that is of sufficient capacity to retain the directory data and which is "recoverable". The term "recoverable" means that original data written to this portion can be recovered by either such portion being error-free or by applying an error-correction code. The data stored in the directory is of such vital importance that no corruption in it can be tolerated.

Upon activating the prior art system, a memory check procedure is executed which classifies blocks as being "good" or "bad". Bad blocks are so marked and are not used for storage of message data. The marking is done with a specifically reserved value stored in the appropriate directory entry for that block. Thus, for example, a 4×1 Mbyte ARAM is partitioned into 1024 blocks, each one having the length of a row (i.e. 4096 bits). The first four blocks are dedicated to the directory, and are error-free. The directory includes 1024 entries, with 8-bits in each entry. Each such entry is related to one block. Also, the directory stores 32-bits per message of message-related data, such as time and date of occurrence. A maximum of 128 messages can be stored. Therefore, 4 Kbits is required to store all of the message-related information. Thus, the prior art directory requires 8 Kbits for the directory information, and 4 Kbits for the message-related information for a total of 12 Kbits.

The necessity for such a recoverable portion, which in the prior art is a 12 Kbit error-free portion that is continuous, seriously limits the extent to which the specification of the memory device can be relaxed. Consequently, the cost savings which accrues from using an ARAM rather than a DRAM is less than what it otherwise could be because out of several grades of quality of a manufactured device, a higher grade must be used to meet this requirement for a lengthy, continuous, recoverable portion. Of course, the directory can also be stored in a separate device, such as a static RAM, but this also increases the total system cost.

A further shortcoming of both approaches is the impracticality of their use with FLASH memories. FLASH memories have the characteristics of (a) being erasable only by simultaneously erasing large portions of, or even the entire, memory, and (b) having a limited number of write/erase cycles, such as 100,000. The combination of these two characteristics can severely limit the usable life of an AFLASH. This is because the directory must be revised every time any one of the blocks of data is written into or erased. If the directory is simultaneously erasable with N blocks, and N=10 for example, then as the directory has been cycled 100,000 times, each of the blocks can experience as few as only 10,000 cycles (if the number of changes of the memory blocks has been equalized, such as by revising them sequentially). Thus, conceivably the blocks could have 90% of their usable life left if it were not for the much higher usage of the blocks storing the directory.

SUMMARY OF THE INVENTION

An object of the present invention is to provide a directory for data stored in a memory that does not require an error-free portion of an electronic memory device.

Another object of the present invention is to/provide a directory for data stored in a memory that does not require one lengthy, continuous recoverable portion having the property of allowing error correction.

Still another object of the present invention is to provide a practical technique that can be used with a FLASH memory device for maintaining a directory of data stored therein without unduly limiting its useful life.

A further object of the present invention is to reduce cost by providing a technique which enables maintaining a directory of data stored in a memory device of lower grade and commensurately lower cost.

These and other objects are attained by one aspect of the invention directed to an apparatus for storing in an electronic memory device data related to a plurality of information items. The apparatus includes an electronic memory device having a data storage area divided into a plurality of blocks each of which comprises a number of storage locations respectively adapted to store one unit of data, each of such blocks having a recoverable portion in a designated part thereof from which original data can be accurately read even though certain errors may be present in the stored data due to part of the device being defective. A means is provided for storing data related to one information item per block, and for storing a directory for the plurality of information items by storing in the designated part of such blocks an identification code unique to the information item for which related data is stored in its block.

Another aspect of the present invention is directed to a method for storing in an electronic memory device data related to a plurality of information items. The method includes the step of dividing a data storage area of the device into a plurality of blocks each of which having a recoverable portion in a designated part thereof from which original data can be accurately read even though certain errors may be present in the stored data due to a part of the device being defective. Data related to one information item is stored per block. Directory data is stored in the designated part of such blocks, including an identification code unique to the information item for which related data is stored in its block.

DETAILED DESCRIPTION OF THE PREFERRED EMBODIMENTS

It is possible with the present invention to reliably retain directory information for data stored in an ARAM or AFLASH device without an error-free section of memory and, moreover, without a lengthy, continuous, recoverable portion having the property of allowing error correction. As explained below, this has a number of significant advantages, including relaxing the specifications required of the memory device, thereby reducing its price, and also making it possible to use a FLASH type of memory device.

Figure 1:
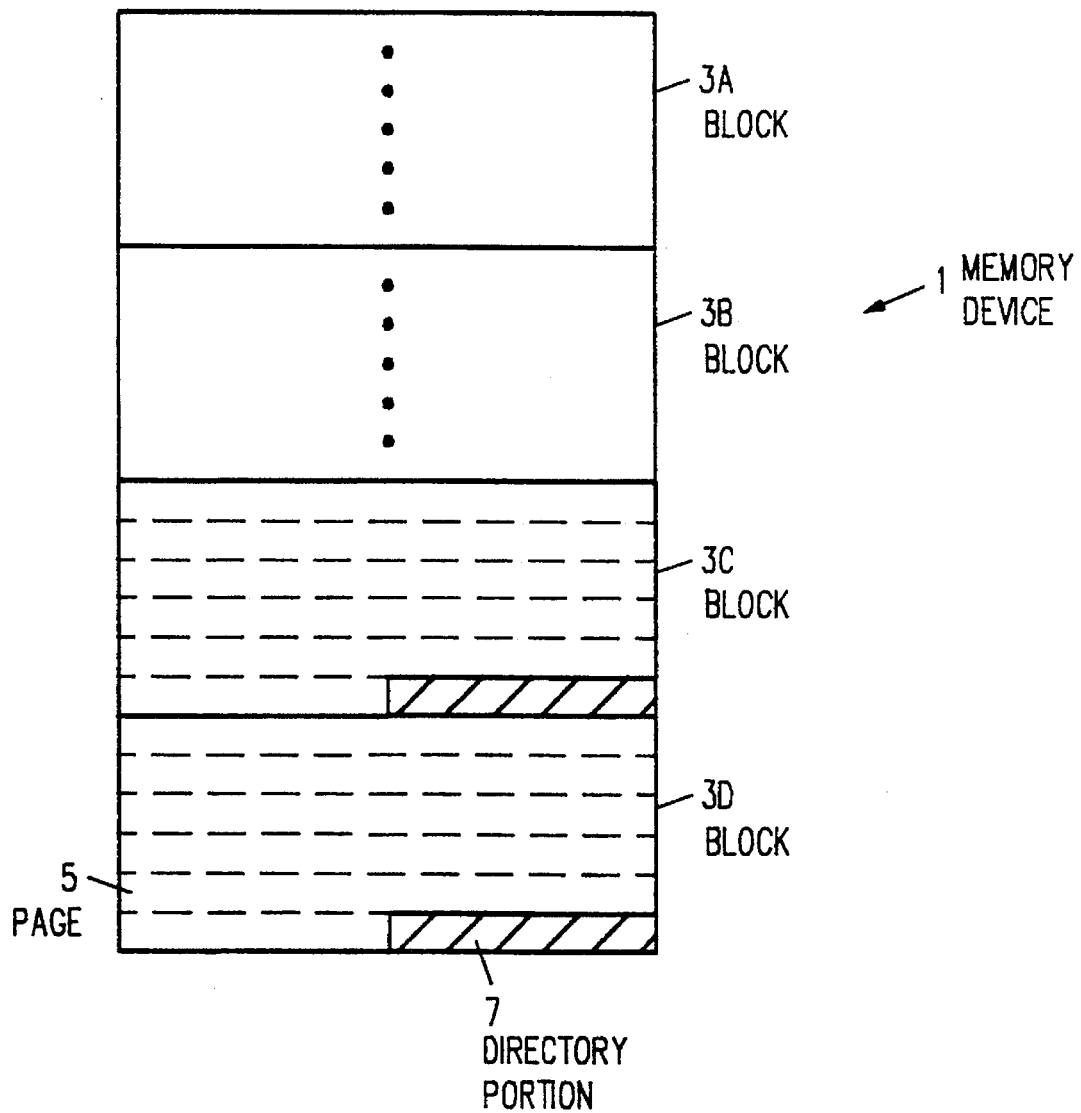
FIG. 1 is a representation of how data stored in a memory device is arranged in accordance with the present invention.

As can be seen from FIG. 1, memory device 1, which can be either an ARAM or a FLASH device, is divided into a plurality of identical blocks 3a–3d. In an ARAM, this division of device 1 into a plurality of blocks 3a–3d is done by virtual partition. This means that the assignment of blocks is not done physically on the device but, rather, by software in a well known manner (details of which are not believed necessary). In contrast, the partitioning of the AFLASH device into blocks is done physically. In either case, the memory capacity of device 1, the size of each block, and the number of blocks are engineering decisions which can be made by the ARAM manufacturer, the user of the ARAM such as, in particular, the designer of a telephone answering machine, or both based, for example, on the requirements of a specific use in an application to which the device is put. Each of blocks 3a–3d is divided into a plurality of pages 5. A convenient way of partitioning each block into pages is to use each row of device 1 as one page. However, portions of a row or a plurality of rows can likewise be assigned to constitute one page.

In accordance with a salient aspect of the present invention, the entire directory is no longer kept as one series of sequential bytes stored in a lengthy, continuous, recoverable portion of the memory. Instead, the directory is distributed so that a portion of it is stored in each of blocks 3a–3d. More specifically, as shown in FIG. 1, each of blocks 3a–3d includes a directory portion 7. Directory portion 7 is positioned at the beginning of the first page of each block. Directory portions 7 of device 1 must be "recoverable". In accordance with one error correction technique, known as the modified Hammington code, the algorithm adds to each group of n-bits of data another group of m-bits of what is known as error correction information. The algorithm enables recovery of the original data if one error has occurred (i.e., a bit changed from 1 to 0 or from 0 to 1) somewhere in the n+m bits of data. It also allows identifying the case of 2 errors occurring, but in such a case the original data cannot be recovered. More than two errors cannot be guaranteed to be identified and will lead to a wrong result. An example of a hardware implementation of such an algorithm can be found in TTL devices such as the 74-F420 made by National Semiconductor Corp. of Santa Clara, Calif. in which n=32 and m=7. In the preferred embodiment, m=4 and n=4 which allows having one error per byte of "recoverable" memory regardless of the location of the defective bit and the type of defect. This technique is described in Richard W. Hamming, "Coding and Information Theory", Prentice-Hall, Second Edition 1986 and Benjamin Arazi, "A Common Sense Approach to the Theory of Error Correcting Codes"", MIT Press Series in Computer Systems, 1988 which are hereby incorporated by reference. For the purpose of performing error correction, the error correction information is generated prior to storage of the message information, and the two types of information are stored as one unit. When data is retrieved, or read, from the ARAM, the error correction information is read along with the message information, and an algorithm is applied to recover the original data. As used herein, the sequence of steps referred to by the terms "reading from" or "writing to" the recoverable section of the memory includes the error correction procedure.

Due to the just-described feature of the present invention which relies on a "recoverable" portion of the device, the restrictions on the relaxation of the specification imposed by the prior art have been significantly eased. It is not necessary to accommodate the directory in a defect-free portion of the memory. It should be noted that if a memory has the property of allowing error correction, then the prior art approaches also do not necessarily need a defect-free portion. However, such approaches do require a lengthy, continuous block of a "recoverable" portion of memory. Such a continuous block can be a restriction severe enough to have an unfavorable impact in terms of raising the price of the memory device. In contrast, only a relatively short, continuous block of a "recoverable" portion of memory is required with the present invention. For example, in the prior art approaches described above, 8 Kbits are used for the directory, and 4 Kbits are used for holding message-related information, such as the time and date the message was recorded. The latter data is also error sensitive. In the present invention, a typical number of such continuous portion of sequential bits in each directory portion 7 would be 60 bits, as explained below, in contrast to the 12 Kbits of the prior art.

Each of the directory portions 7 includes the following information which is categorized into fields of the directory. The first field in the directory is for storing an identification code unique to an item of information. In our example of a telephone answering machine, the identification code is a message number. All the blocks associated with a specific voice message are tagged with the same message number which is stored in this field for all of the affected blocks. The second field is a bit used to store a flag which indicates whether the current block is the first block into which data belonging to this message number is stored. The third field stores linking data that points to the next block into which data belonging to the same message is stored.

A fourth field stores the formatting information specific to its block. As has been explained above, an ARAM and an AFLASH device used in a telephone answering machine, for example, can have an acceptable number of bad bits. For example, these bad bits can total 0.5% of the memory capacity depending, for example, on the tolerance of the voice storage format or voice compression algorithm for errors, and the trade-off between price and the user's preference for audio quality. The formatting information is arranged page-by-page so that a determination can be made whether a page is of a quality sufficiently high to use for storing the audio information, in which case with the use of one bit the page is labeled as "good". Otherwise, it is labeled "bad".

The preferred size of each field is 8-bits for the message number, 1-bit for the first block indication, 11-bits for the linking data, and 8-bits for the formatting data (assuming 8 pages per block), for a total of 28 bits. In addition to that, 4bytes (i.e. 32 bits) are made available for the message-related information described above, for a total of 60 bits. For a 4×1 Mbyte ARAM with 1024 rows, these rows can be virtually partitioned into 256 blocks, thereby allowing for a maximum of 256 messages since each block is dedicated to one message. If 60 bits are required in the directory for each of the blocks, the capacity of the distributed directory must be 15 Kbit. If an error-free portion of the ARAM is used to accommodate the directory, then the 15 Kbit capacity is sufficient. However, if the portion of the ARAM is not error-free, then the recoverable portion must have an increased capacity to store the error correction information. For example, for the Hammington error correction algorithm that operates on 4-bit data groups, 4-bits of error correction information is stored for every 4-bits of message information. This allows having up to one error for each eight bits while still recovering the original data. In such a case, the directory size will be 30 Kbits. If the grade of the ARAM is higher thereby requiring less error correction information (e.g. 32bit data plus 7-bit error correction information) the increase in directory size is smaller.

Each time power is newly applied to an ARAM, or for an AFLASH once in the life of the machine, an initialization procedure (not shown) is performed in which the formatting information is stored into the fourth field in the directory of each block 3. This formatting information is available from a previously conducted analysis of the device 1 in accordance with commonly known procedures. Also, each of the blocks is marked as being "free" for accepting information thereinto. In accordance with the present invention, the blocks can be marked as "free" by advantageous usage of the message number field. The storage of a particular number into this message field is regarded as being indicative of a "free" block. Thus, for example, the binary value 11111111 is such an indication of a free block. Initially, all of the blocks have this value stored into the respective message number fields.

Figure 2A:
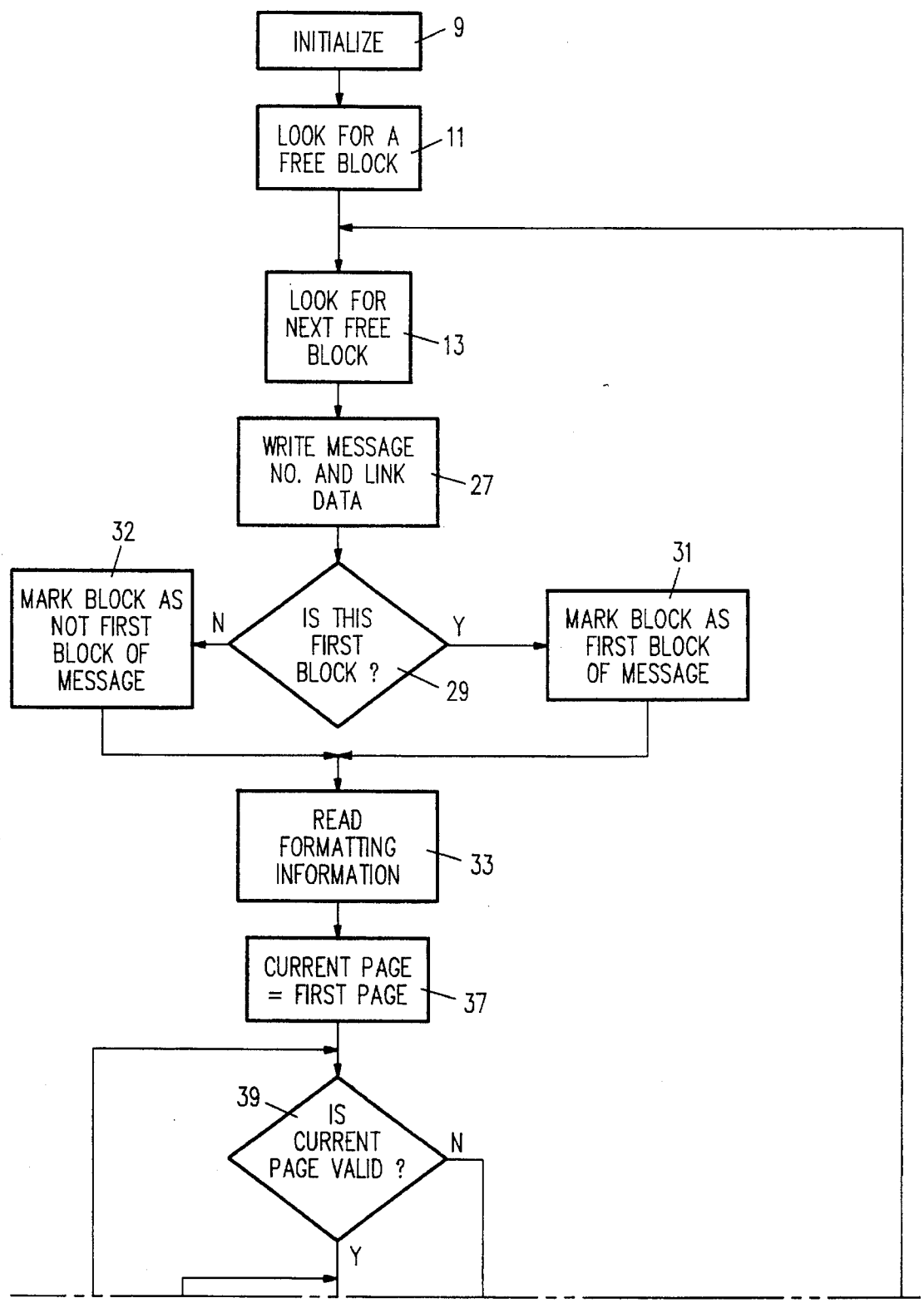
FIG. 2 is a flow chart of the steps used for storing data into the directory portion and the data portion of a memory device in accordance with the present invention.

Turning now to FIG. 2, the initialize step 9 is executed each time a new message is to be stored to memory. For example, when the receipt of an incoming voice message has been detected, the control circuitry of the telephone answering machine (not discussed herein) assigns a message number to it. With that done, the routine proceeds to step 11 in order to look for a block that is free to accept the storage of data thereinto. The details of step 11 are depicted in FIG. 3.

Figure 3:
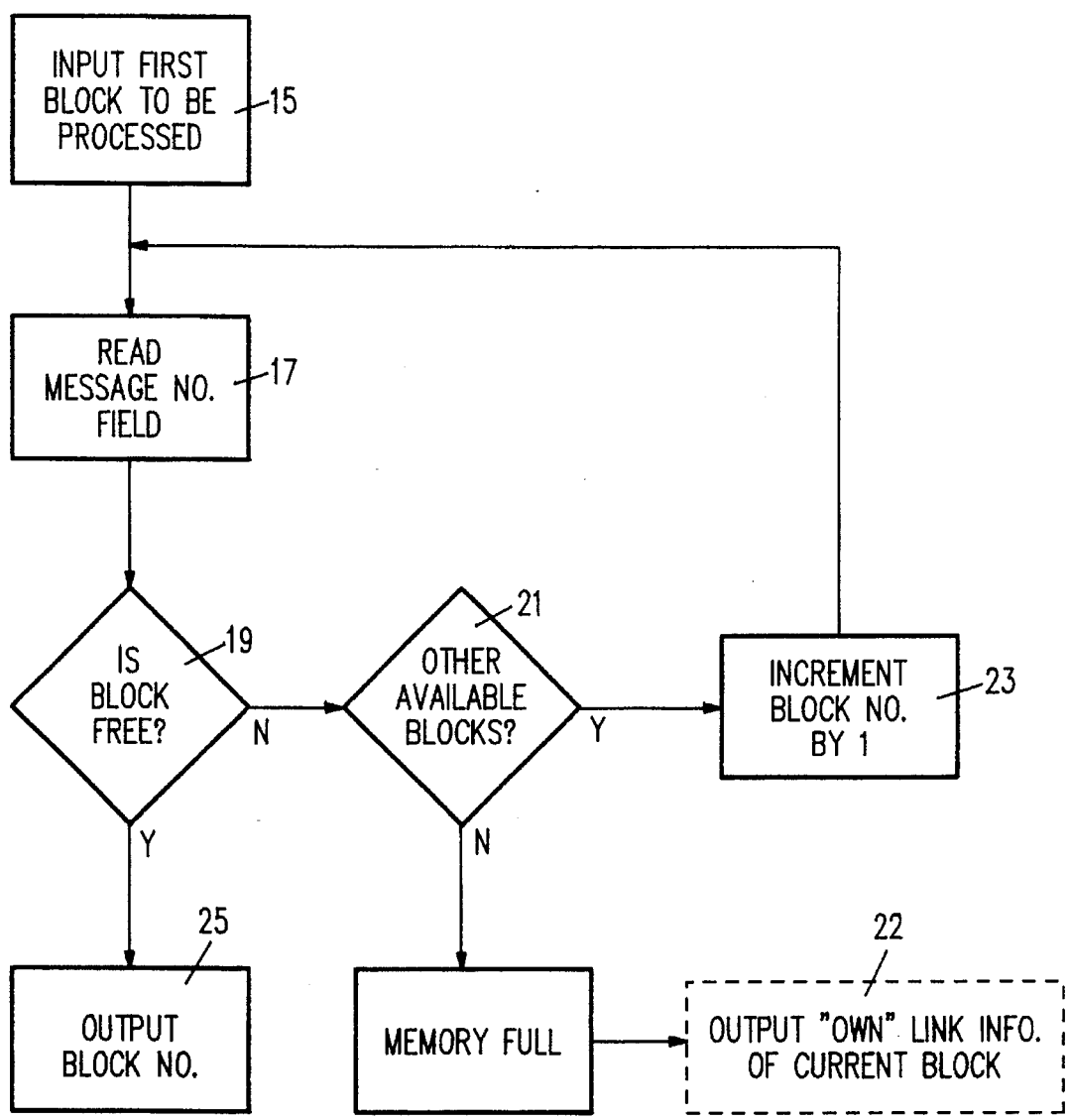
FIG. 3 is a flow chart depicting details of one of the steps shown in FIG. 2.

In FIG. 3, step 15 derives the number of a first block 3 of device 1 to be checked regarding its status. In the case of an ARAM, the first block to be checked is block 0. For an AFLASH, it is highly advantageous to equalize to the extent possible the number of changes undergone by each of the blocks in view of the limit of write/erase cycles, as discussed above. Consequently, the first block to be checked is selected based on a notation of the last recorded block. Such a notation can be stored in another memory (not shown). Recording from that block then proceeds sequentially in the succeeding free block(s). An alternative is to avoid the need to keep such a notation and, instead, to select a block with a random number generator. Any known type of random number generation may be used. Let us call the randomly picked number "R". Starting from the first block of the AFLASH, the "R"th unused block will be selected, and storage of the message will begin with it. Since this is a statistical method, it may not completely equalize usage of all of the blocks in the AFLASH.

With step 15 concluded, step 17 then reads the message field of the current block, and step 19 checks whether the current block has the status of being "free". This is done by determining whether the value stored in the message number field is 11111111. If it is not, then step 21 checks whether the device 1 has any more blocks 3 in it. In an ARAM, this means checking whether the highest number block (e.g. no. 255 in the example of having 256 blocks) in the numerical sequence of blocks available in the ARAM has been reached. For an AFLASH, if block no. 10 was selected by step 15 to be the first block, as per the above, then step 21 cycles through all the other blocks, returns to block no. 0 and progresses to step no. 9 which is regarded as being the last block. If step 21 determines that more blocks are available, then the number of the current block is incremented by 1, per step 23, and the sub-routine returns to once more perform step 17. However, if step 21 produces a negative answer indicating that no more blocks are available, this is indicative of the fact that the memory is full. As a consequence, the telephone answering machine may simply hang up or provide an announcement to the caller that no message can be recorded. Of course, other options are also available, but details of no such options are believed necessary to describe the present invention. If step 19 produces a positive answer which indicates that a free block is available, then that block number is outputted by step 25 for use by step 27 (see FIG. 2).

In addition to step 11 identifying a free block into which the storage of a voice message can be initiated, step 13 also looks for the next free block which will be required in case the length of the voice message exceeds the memory capacity of a single block. The next free block is identified in the same way as shown in FIG. 3 to find the current block. Consequently, the outputs of step 11 and step 13 are block numbers for both the current block as well as the next free block. If, however, memory full is encountered by step 21 as part of step 13, step 13 directs that the link information stored in the current block be the number of the current block itself. This function is included in box 22 which is depicted by broken lines in FIG. 3 to distinguish it from the other boxes which apply only to step 11. A block pointing to itself is regarded, as explained below, as a signal for end of message.

Returning now to FIG. 2, the current block number and the next block number information produced by step 11 and step 13 are used by block 27. The current block number is used to access that current block and the message number is written into its message number field. Also, the block number of the next free block is stored in the third field of its directory portion 7 as linking data. In step 29 a determination is made whether this is the first block into which data belonging to the current message (i.e. at least the beginning of the message) is being stored. Such a determination can easily be made by known techniques readily apparent to one with ordinary skill in the art and, therefore, no details are provided herein. If the current block is determined to be the first block, then the flag in the second field is suitably marked, as per step 31. If not, then the flag is suitably marked accordingly, per step 32. Either way, the routine proceeds to step 33 which reads the formatting information stored in the fourth field of the current block and uses it to perform a sequence of steps beginning with step 37 for writing data into the current block.

Step 37 sets the first page of the current block to be the current page. Step 39 determines whether the current page is valid for the purpose of storing data thereinto. This is done by checking the formatting data available from step 33. If the current page is suitable for data storage, then data is written thereinto, per step 41. Any one of a number of well known techniques can be used for this purpose and, therefore, no details are deemed necessary.

It is noteworthy to point out at this time that one way of obtaining data for storage in device 1 is via a first in, first out storage device referred to below as "FIFO" (not shown). The FIFO can be implemented in hardware or software. Data is stored in the FIFO as it is received from the telephone line. This data is retrieved from the FIFO in accordance with the timing requirements of the clock which controls operation of the various steps discussed herein for implementing the present invention. Such a FIFO is one example of what is broadly referred to herein as the data generator. Thus, step 41 retrieves data from the data generator and writes it into the current page of the current block.

In the normal operation of a FIFO, a specified number of its bits is retrieved. Once that number of bits is stored in device 1 per step 41, step 43 determines whether the data generator is empty. If it is not, this means that additional data remains in the FIFO for storage in the current page. However, before further data can be written into the current page, step 45 determines whether the current page is full. This is done by determining whether the current page has sufficient capacity to accept the number of bits being transferred into it from the data generator. If the current page is not yet full, then step 41 is again performed. However, if step 45 indicates that the current page is full, then step 47 determines whether the current page is the last page of the block. If it is not, then the value of the current page number is incremented by 1, per step 49, and the routine is directed back to step 39 so that the newly designated current page can be checked as to whether it is valid for storage of data. If, however, step 47 indicates that the current page is the last page of the current block, then step 51 uses the previously determined number of the linked block stored in the third field to go to that linked block which, of course, then becomes the current block. From step 51 the routine returns to step 13 which determines the next free block with which the newly designated current block is to be linked. However, if step 52 determines that the current block is linked to itself, this is indicative of an end-of-message condition, and step 54 terminates message recordal.

If the determination made in step 43 is positive, thus indicating that the data generator is empty, then step 53 determines whether the end of message signal has been received. This is a conventional determination made based on signals in common usage which can be a part of the message information. For example, such a signal can be a line signal sent by the switchboard indicating that the other party has hung up, a low line energy as measured over a period of a few seconds indicating termination of conversation from the other party, and/or that a local time-out on message length has been reached. If from step 53 it is apparent that more of the message is yet to come, a wait step 55 of predetermined duration is used to allow additional time for the expected data to arrive. Step 43 is then repeated. If, however, step 53 indicates that the end-of-message signal has been obtained, then no further data storage into device 1 is necessary, and the routine has reached its end so that message recording is stopped.

Figure 4:
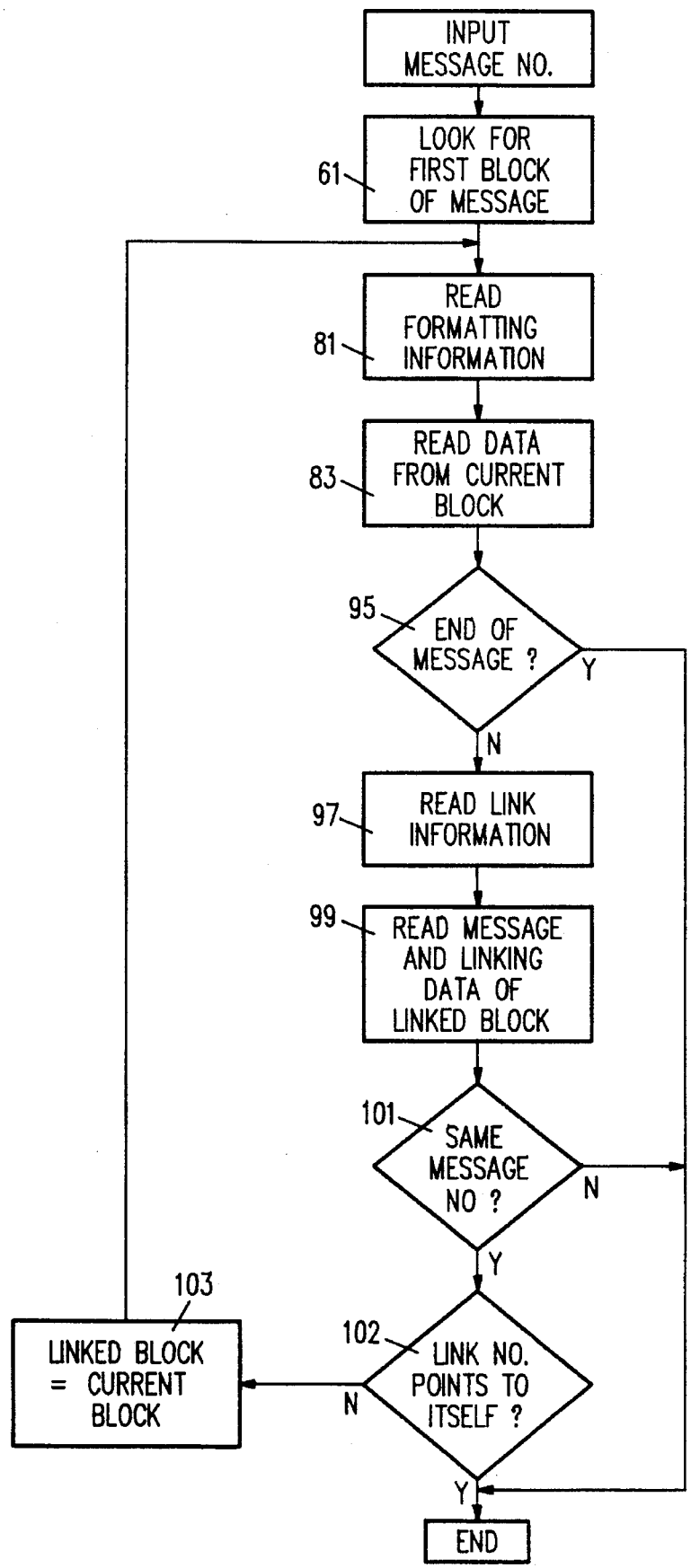
FIG. 4 is a flow chart of the steps used for retrieving data from a memory device in accordance with the present invention.
Figure 5:
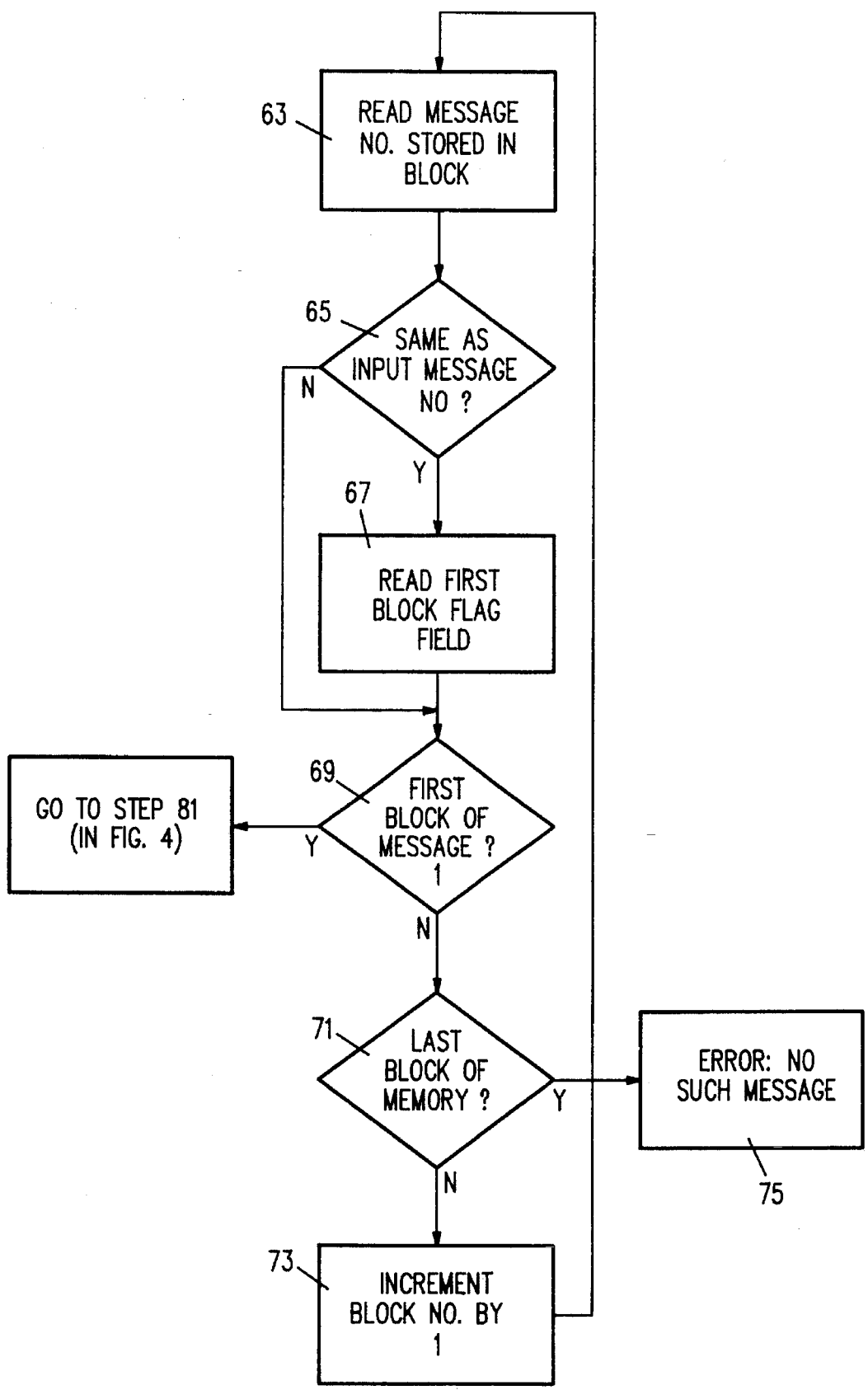
FIG. 5 is a flow chart depicting details of one of the steps shown in FIG. 4.

Retrieval of the data stored in device 1 per the present invention as described above is explained below in connection with FIGS. 4–6. Specifically, the operation per FIG. 4 can be started with the user actuating the telephone answering machine into its playback mode. This can be done in a conventional fashion by requesting that all of the voice messages be sequentially played back from the first until the last, or the user can specify a particular message number. In either case, at the beginning of FIG. 4 it is assumed that a specific message number has been requested. Accordingly, step 61 looks for the first block into which data corresponding to this specified message number has been stored. Details of step 61 are depicted in FIG. 5, which will now be discussed.

At this point there is no way of knowing which one of blocks 3a–3d in device 1 is the first block containing data for the message of interest. Consequently, it is possible to start with any block of device 1 and to scan all the blocks cyclically. If, for example, block no. 10 is the selected block, the message number stored in the first field of block no. 10 is read, per step 63. Step 65 determines whether the stored message number is the same as the one of interest. If it is, then step 67 reads the data stored in the second field, and step 69 determines whether the flag indicates that this is the first block of the message. If it is, then this sub-routine is exited by proceeding to step 81 in FIG. 4 (which is explained below). However, if the current block is not the first block of the message, then step 71 determines whether the current block is the last available block in device 1 available to be checked. If the current block is not the last block, then step 73 increments the value of the current block number by 1, and the sub-routine returns to perform step 63 for block no. 11. However, if the current block number is the last available block number (i.e. block no. 9), then step 75 produces an error indication to show that the requested message number of interest does not exist. This can be a visual or audible indication to the user, for example.

Figure 6:
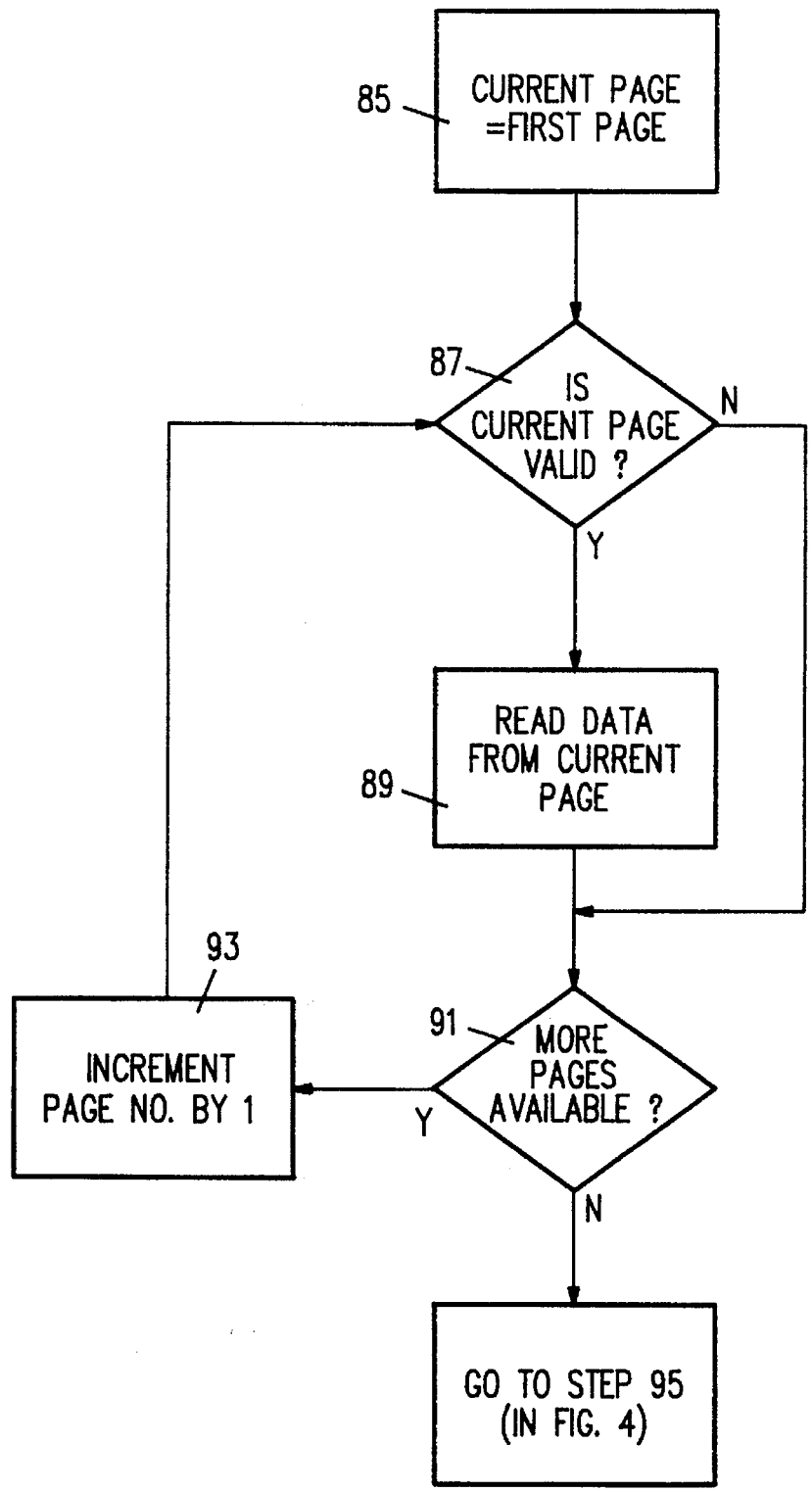
FIG. 6 is a flow chart depicting details of another one of the steps shown in FIG. 4.

Returning now to FIG. 4, once the first block in the message of interest has been identified per step 61, step 81 reads the formatting data stored in the fourth field, and then step 83 proceeds to read the data stored in the current block. Details of how this is done are depicted in FIG. 6, which will now be explained. Step 85 sets the first page number of the current block as the current page. Step 87 then checks the formatting data to determine whether the current page is considered to be valid and, therefore, whether it can be relied upon to contain valid data. If it is, then step 89 reads the data from the page and sends it to suitable decoding circuitry (not shown) which converts it to voice. Any one of a number of well known techniques can be used for this purpose and, therefore, no details are deemed necessary. Step 89 also includes the operations required by the Hammington error correction algorithm.

Following the retrieval of data from the current page, step 91 determines whether any more pages exist in the current block. If so, then the value of the current page is incremented by 1, per step 93. The sub-routine then returns to perform step 87 once more. However, if the current page is the last page in the current block, then the operation proceeds to step 95 (return to FIG. 4 at this point) which determines whether the end-of-message signal has been received. Such a signal can be made a part of the message data, or it can be the result of a block pointing to itself as the linked block, as discussed above in connection with step 13. If the end-of-message signal has been received, then the data retrieval operation is complete, and this routine has reached its end. However, if the determination made by step 95 is negative, then step 97 identifies the next block which is linked to the current block by virtue of the data stored in its third field, as described above. The message number and linking number of the linked block are then read in accordance with step 99. Step 101 checks whether the message number of the next linked block is the same as the current message number of interest. If it is, then step 102 checks whether the linking data of the block points to itself. As explained above, this is an end-of-message indication and, therefore, a positive finding leads to termination of the routine. However, if the linking data points to another block, then step 103 replaces the value of the current block number with that of the next block number, and the newly designated current block number is then processed by returning to step 81 and repeating it and the subsequent steps in accordance with the description provided just above. If the determination made by step 101 is negative, this indicates that the linked block was not, in fact, needed to store data from the message of interest because that block was eventually assigned to another message and, therefore, the message retrieval is regarded as being at an end. Although the end of message can be determined by step 95, for example, which occurs earlier, steps 101 and 102 are useful because the end of message signal indication is in some cases not found in the message information stored in the memory due to memory errors. In such a case, the end of link indication determined by steps 101 and 102 will terminate the message playback.

Figure 7:
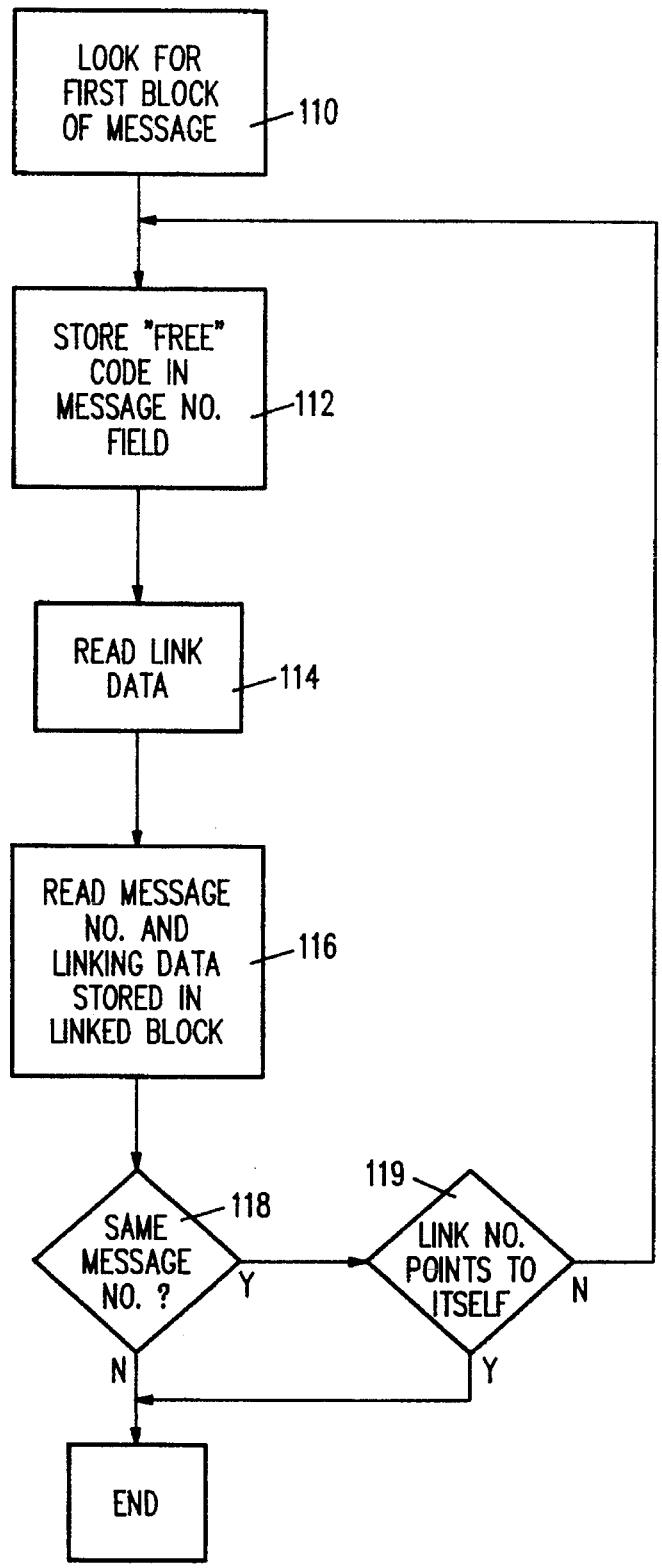
FIG. 7 is a flow chart of steps used for erasing an ARAM device.

In addition to the message storage and message retrieval operations described in detail above, another important task which needs to be performed in a telephone answering machine application is the erasure of stored data so that the affected blocks can be reused for the purpose of storing new data. FIG. 7 explains how this is done for an ARAM, and FIG. 8 depicts how such erasure is carried out for an AFLASH device.

Turning now to FIG. 7, step 110 has received a particular message number to be erased, and it then looks for the first block belonging to that message number. This operation is the same as described above in connection with FIG. 5. Once the first block for the message number of interest has been identified, step 112 changes the message number data in its first field to the number described above as being indicative of a "free" block, namely 11111111 in our example. Step 114 identifies the next block which is linked to the current block, and step 116 reads the data stored in the message number field and linking data field of the next linked block. Step 118 determines whether the same message number is stored in the next linked block, and if so, step 119 checks whether the block points to itself which indicates that the routine is to be terminated. If, however, the linking data points to another block, the flow returns from step 119 to step 112 to designate that block as being "free" as well. This is repeated until step 118 finds that the next linked block has a different message number, which brings the sub-routine to its end.

Figure 8:
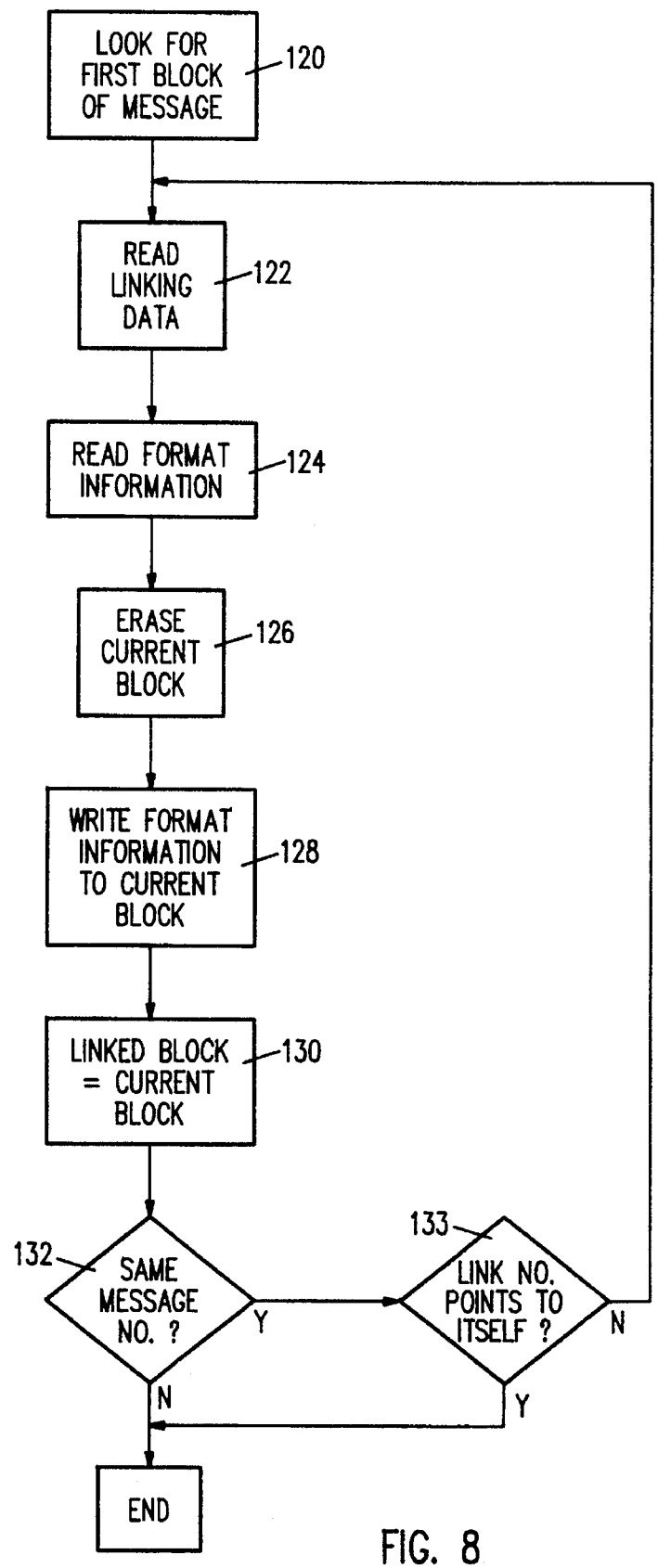
FIG. 8 is a flow chart of steps used for erasing an AFLASH device.

FIG. 8 describes an operation for erasing an AFLASH which of necessity is different from the operation described in FIG. 7 for erasing an ARAM. This operation is necessary due to the above-described operational characteristics of an AFLASH which require erasure in large groups of bits rather than in specifically designated bits as is possible with other types of memory devices, and due to the need for erasure prior to writing new data. In this embodiment, it is assumed that the AFLASH is erasable in units of blocks 3a–3d. Specifically, once a message number has been designated for erasure, step 120 looks for the first block of that message number. This operation is the same one described above in FIG. 5. Step 122 reads the link data and step 124 reads the format data, and both are stored in a temporary memory (not shown). Step 126 then erases all the memory locations in the entire current block simultaneously, and step 128 then re-writes the format data into the appropriate portion of the current block because this data must be permanently retained. Step 130 then retrieves the temporarily stored link information to identify the next linked block. Step 132 determines whether the message number in the next linked block is the same, and if so, step 133 checks whether the block points to itself which indicates that the routine is to be terminated. If, however, the linking data points to another block, the operation returns from step 133 to step 122, as described above. If, however, the determination made by step 132 is negative, then the erasure operation is regarded as having reached its end.

In a variation of the technique shown in FIG. 8, steps 122, 124 and 126 can be replaced by a step in which a specially designated bit is used as a flag to mark the block as being valid or invalid. Preferably, however, the blocks will be marked by entering 00000000 as the message number thereby avoiding the need for a specially designated bit. Then, steps 130, 132, 133 and 122 are repeated until all of the relevant blocks are flagged in this way. With that done, an erasing step is performed for all of the blocks which have been marked invalid. After the erasing step, step 128 writes the formatting data back into the erased blocks. It is also possible to repeat the marking step for a number of messages retained in a section of memory, and then all the blocks in such section will be erased together.

An appreciation of the above-described invention reveals that it is highly advantageous for use with ARAM and FLASH devices. Due to the relaxed specifications for such devices made possible by the present invention, a significant cost savings is achieved. Moreover, it is no longer necessary with any FLASH device to erase the directory each time a block of the device is altered. Instead, by associating each block with its dedicated directory, only that one block which is being altered needs to have its directory changed commensurately. By suitably controlling the AFLASH device so that the changes made to the data in the memory are equally distributed among the blocks and, therefore, each block goes through substantially the same number of write/erase cycles, the usable life of the AFLASH device is lengthened, thus making the use of an AFLASH practical in the contemplated application of interest.

Although specific embodiments of the present invention have been described in detail above, various modifications thereto will be apparent to one with ordinary skills in the art. For example, the flow of operations depicted in FIG. 2 is designed to access the directory only once. The linked block is selected by step 13 which immediately follows step 11 that selects the current block, and the third field can thus be completed at that point. Of course, it is also possible to perform step 13 after, say, step 47 and to write the linking data into the third field by returning to the directory at that point in the routine. However, it may be more efficient in terms of computer processing time to avoid doing so. Other possible modifications include the use of any of a number of known error correction methods other than the one mentioned above. Also, the number of pages per block can be varied, including having only one page per block which avoids the necessity of a field for storing formatting data. Instead, such data could be stored as a predetermined message number. Furthermore, the "recoverable" area for storing the directory can be placed in parts of the block other than the beginning of the first page. In addition, the distribution of the data can be such that directory data for, say, four blocks can be stored in the "recoverable" area of one of them. Thus, using the embodiment of FIG. 1 as an example, the first page of block 3*a* in a sequence of four such blocks 3*a*, 3*b*, 3*c* and 3*d* would have a corresponding directory portion 7*a*, and the other blocks would have respective directory portions 7*b*, 7*c* and 7*d*. Thus, "recoverable" area 7 in block 3*a* would be four times as long as its length would be when it stores directory data for only block 3*a*. Even though this approach requires a longer, continuous recoverable portion, its advantages are still great when compared to the prior art approaches. Another possible modification eliminates the need for the second and third above-described fields. Only the first field, i.e. the message number data, would be retained along with, if necessary, the formatting data of the fourth field. The need for the second and third fields can be removed, for an ARAM, if a message is stored by always searching for a free block starting from block no. 0 and sequencing through the other blocks. Thus, if block no. 105 happens to be the first free block because block nos. 0 to 104 contain data, the beginning of the message will be stored in block no. 105. If additional blocks are required, then the next free block, in numerical sequence, will be selected. Thus, when the message is retrieved from memory, the search for the message no. will also be started at block no. 0, and similarly after the first block is read, the search for other blocks will continue in numerical sequence through the remaining blocks of the ARAM. Thus, with this approach the first block encountered by the search with a related message no. of interest is presumed to be the first block of that message. This eliminates the need for the second field. Every other block with the same message no. is also presumed to be encountered in its proper sequence in terms of the message data it contains. This eliminates the need for the third field. Although the invention has been described in particular as being applicable to audio information, and specifically voice, the invention can be applied to the storage and retrieval of any information which is error-tolerant to some extent. All these and other such modifications are intended to fall within the scope of the present invention as defined by the following claims.

We claim:

1. Apparatus for storing in an electronic memory device original data related to a plurality of information items, comprising:

an electronic memory device having a data storage area divided into a plurality of blocks each of which comprises a number of storage locations for storing one unit of data in each of said locations, each of said blocks having a recoverable portion in a designated part thereof from which the original data can be accurately read even though part of the electronic memory device is defective; and control means for automatically storing the original data related to one of the plurality of information items per block, and for storing a directory for the plurality of information items by automatically storing in said designated parts of said plurality of blocks identification codes unique to the plurality of information items for which related data is respectively stored in said plurality of blocks.

2. The apparatus of claim 1, wherein said storing means further stores in said designated part of each block linking data identifying one of said blocks in which the same identification code is stored.

3. The apparatus of claim 2, wherein said storing means further stores in said designated part of each block data indicating whether such block contains data related to a beginning of an information item.

4. The apparatus of claim 3, wherein said storing means further stores in said designated part of each block formatting data indicating whether predetermined groups of storage locations are regarded as respectively enabling accurate reading of original data therefrom.

5. The apparatus of claim 4, further comprising reading means for retrieving data stored in the electronic memory device and related to a specific information item by searching for the blocks having an identification code stored in said designated part thereof which is unique to such information item, and reading the data stored therein.

6. The apparatus of claim 5, further comprising erasing means to search for blocks to be erased having an identification code stored in said designated part thereof which is unique to a specific information item, and enabling the storage of new data into such blocks.

7. The apparatus of claim 6, wherein said electronic memory device is a random access memory ("RAM").

8. The apparatus of claim 7, wherein said erasing means stores a code in said designated part of a block to be erased to indicate such block as being free to accept new data.

9. The apparatus of claim 6, wherein said electronic memory device is a Flash electrically erasable and programmable read only memory ("FLASH").

10. The apparatus of claim 9, wherein said storing means substantially equalizes the number of write/erase cycles experienced by said FLASH blocks.

11. The apparatus of claim 9, wherein said erasing means erases the data stored in such blocks to be erased.

12. The apparatus of claim 1, further comprising reading means for retrieving data stored in the electronic memory device and related to a specific information item by searching for the blocks having an identification code stored in said designated part thereof which is unique to such information item, and reading the data stored therein.

13. The apparatus of claim 1, further comprising erasing means to search for blocks to be erased having an identification code stored in said designated part thereof which is unique to a specific information item, and enabling the storage of new data into such blocks.

14. The apparatus of claim 1, wherein said electronic memory device is a random access memory ("RAM").

15. The apparatus of claim 1, wherein said electronic memory device is a Flash electrically erasable and programmable read only memory ("FLASH").

16. The apparatus of claim 15, wherein said storing means substantially equalizes the number of write/erase cycles experienced by said FLASH blocks.

17. The apparatus of claim 1, wherein one of the identification codes stored in the designated part of one of said plurality of blocks is associated with data stored in a number of said plurality of blocks, said number being less than the total number of blocks in the electronic memory device.

18. A method for storing in an electronic memory device original data related to a plurality of information items, comprising the steps of:

dividing a data storage area of the electronic memory device into a plurality of blocks each of which having a recoverable portion in a designated part thereof from which the original data can be accurately read even though a part of the electronic memory device is defective;

assigning the designated part of each of said blocks to storing directory data;

controlling a storing of the original data in the electronic memory by automatically storing in said plurality of blocks the original data related to one information item per block; and automatically storing in the designated parts of said plurality of blocks directory data including identification codes unique to the plurality of information items for which related data is respectively stored in said plurality of blocks.

19. The method of claim 18, further comprising the step of retrieving the stored data related to a specific information item by searching for the blocks having an identification code stored in said designated part thereof which is unique to such information item, and reading the data stored therein.

20. The method of claim 18, further comprising the step of searching for blocks to be erased having an identification code stored in said designated part thereof which is unique to a specific information item, and enabling the storage of new data into such blocks.

21. The method of claim 20, wherein said electronic memory device is a random access memory ("RAM"), and further comprising the step of storing a code in said designated part of a block to be erased to indicate such block as being free to accept new data.

22. The method of claim 20, wherein said electronic memory device is a Flash electrically erasable and programmable read only memory ("FLASH"), and wherein said storing step includes substantially equalizing the number of write/erase cycles experienced by said FLASH blocks.

23. The method of claim 22, further comprising the step of erasing the data in such blocks to be erased.

24. The method of claim 18, wherein said electronic memory device is a Flash electrically erasable and programmable read only memory ("FLASH"), and wherein said storing step includes substantially equalizing the number of write/erase cycles experienced by said FLASH blocks.

25. The method of claim 18, wherein the step of storing identification codes comprises associating one of the identification codes stored in one of said plurality of blocks with data stored in a number of said plurality of blocks, said number being less than the total number of blocks in the electronic memory device.

26. The method of claim 17, further comprising the step of storing in said designated part of each block linking data identifying whichever one of said blocks having the same identification code stored therein.

27. The method of claim 26, further comprising the step of storing in said designated part of each block data indicating whether such block contains data related to a beginning of an information item.

28. The method of claim 27, further comprising the step of storing in said designated part of each block formatting data indicating whether predetermined groups of storage locations respectively enable accurate reading of original data therefrom.

* * * * *